US008852305B2

(12) United States Patent
Andersson et al.

(10) Patent No.: US 8,852,305 B2
(45) Date of Patent: Oct. 7, 2014

(54) NANOLAMINATED COATED CUTTING TOOL

(75) Inventors: Jon Andersson, Vasteras (SE); Rachid M'Saoubi, Fagersta (SE); Hindrik Engstrom, Soderbarke (SE); Mats Johansson, Linkoping (SE)

(73) Assignee: Seco Tools AB, Fagersta (SE)

( * ) Notice: Subject to any disclaimer, the term of this patent is extended or adjusted under 35 U.S.C. 154(b) by 317 days.

(21) Appl. No.: 13/375,570

(22) PCT Filed: May 28, 2010

(86) PCT No.: PCT/SE2010/050580
§ 371 (c)(1),
(2), (4) Date: Jan. 24, 2012

(87) PCT Pub. No.: WO2010/140958
PCT Pub. Date: Dec. 9, 2010

(65) Prior Publication Data
US 2012/0114436 A1    May 10, 2012

(30) Foreign Application Priority Data

Jun. 1, 2009 (SE) ........................ 0900739

(51) Int. Cl.
*C23C 14/00* (2006.01)
*C04B 41/52* (2006.01)
(Continued)

(52) U.S. Cl.
CPC .............. *C04B 41/52* (2013.01); *C04B 41/009* (2013.01); *C04B 41/89* (2013.01); *C23C 14/0641* (2013.01);
(Continued)

(58) Field of Classification Search
CPC ...... C04B 41/87; C04B 41/89; B23B 27/148; C22C 29/00; C23C 14/0641; C23C 14/24

USPC ............ 51/307, 309; 428/216, 336, 469, 472, 428/697, 698, 699, 704; 204/192.1
See application file for complete search history.

(56) References Cited

U.S. PATENT DOCUMENTS 5,330,853 A    7/1994   Hofmann et al.
5,503,912 A    4/1996   Setoyama et al.
(Continued)

FOREIGN PATENT DOCUMENTS

EP    0588350 A2    3/1994
EP    0709483       5/1996
(Continued)

OTHER PUBLICATIONS

International Search Report dated Sep. 3, 2010, corresponding to PCT/SE2010/050580.

*Primary Examiner* — Archene Turner
(74) *Attorney, Agent, or Firm* — Young & Thompson

(57) ABSTRACT

A cutting tool insert for machining by chip removal includes a body of a hard alloy of cemented carbide, cermet, ceramics, cubic boron nitride based material or high speed steel, onto which a hard and wear resistant coating is deposited by physical vapor deposition. The coating includes a polycrystalline nanolaminated structure of alternating layers A and B where layer A is (Ti,Al,Me1)N and Me1 is optionally one or more of the metal elements from group 3, 4, 5 or 6 in the periodic table, layer B is (Ti,Si,Me2)N and Me2 is optionally one or more of the metal elements from group 3, 4, 5 or 6 in the periodic table including Al with a thickness between 0.5 and 20 μm and method of making the same. This insert is particularly useful in metal cutting applications generating high temperatures with improved edge integrity, machining of super alloys, stainless and hardened steels.

18 Claims, 3 Drawing Sheets

(51) Int. Cl.
    *C04B 41/00* (2006.01)
    *C04B 41/89* (2006.01)
    *C23C 14/06* (2006.01)
    *C23C 28/00* (2006.01)
    *C23C 30/00* (2006.01)
    *C23C 28/04* (2006.01)

(52) U.S. Cl.
    CPC ............... *C23C 28/42* (2013.01); *C23C 30/005* (2013.01); *C23C 28/044* (2013.01); *C23C 28/042* (2013.01); *B23B 2222/36* (2013.01); *B23B 2224/24* (2013.01); *B23B 2228/08* (2013.01); *B23B 2228/10* (2013.01)
    USPC .......... 51/307; 204/192.1; 428/216; 428/336; 428/469; 428/472; 428/697; 428/699

(56) References Cited

U.S. PATENT DOCUMENTS

| | | | |
|---|---|---|---|
| 6,077,596 A | 6/2000 | Hashimoto et al. | |
| 6,103,357 A | 8/2000 | Selinder et al. | |
| 6,254,984 B1 | 7/2001 | Iyori | |
| 6,309,738 B1 | 10/2001 | Sakurai | |
| 6,586,122 B2 * | 7/2003 | Ishikawa et al. | 428/698 |
| 7,056,602 B2 | 6/2006 | Horling et al. | |
| 8,003,232 B2 * | 8/2011 | Johansson et al. | 428/697 |
| 2006/0182999 A1 | 8/2006 | Yamamoto | |
| 2006/0246320 A1 | 11/2006 | Kathrein et al. | |

FOREIGN PATENT DOCUMENTS

| | | | |
|---|---|---|---|
| EP | 1736565 A1 | | 12/2006 |
| EP | 1939327 A1 | | 7/2008 |
| JP | 08-127862 | | 5/1996 |
| JP | 2000326107 A | | 11/2000 |
| JP | 2000-334606 | * | 12/2000 |
| JP | 2000334607 A | | 12/2000 |
| JP | 3347687 | | 11/2002 |
| JP | 2006-225708 | * | 8/2006 |
| JP | 2010076084 A | | 4/2010 |

* cited by examiner

NANOLAMINATED COATED CUTTING TOOL

BACKGROUND OF THE INVENTION

The present invention relates to a cutting tool insert coated with a hard and wear resistant coating comprising a nanolaminated structure based on (Ti,Al)N and (Ti,Si)N layers, respectively. This insert is particularly useful in metal cutting applications generating high temperatures, e.g., machining of super alloys, stainless steels and hardened steels. The coating is grown by physical vapour deposition (PVD) and preferably by cathodic arc evaporation.

U.S. Pat. No. 7,056,602 discloses a cutting tool insert coated with a cubic structured $(Ti_yAl_xMe_{1-x-y})N$ based layer where Me is one of the elements: Zr, Hf, V, Nb, Ta, Cr, Mo, W or Si, and: x is between 0.50 and 0.80; the ratio, x/(x+y), is between 0.50 and 0.85; the sum of Ti and Al subscripts, x+y, is between 0.7 and 1.0.

EP 1736565 discloses a cutting tool cubic boron nitride based insert coated with a cubic structured (Me,Si)X phase, where Me is one or more of the elements Ti, V, Cr, Zr, Nb, Mo, Hf, Ta and Al, and X is one or more of the elements N, C, O or B EP 0588350 discloses a hard layer of Ti—Si—N composite material on a body, the layer being deposited using a source of evaporation possessing a composition of $Ti_aSi_b$ with a in the range of 75-85 at % and b 15-25 at %.

Coating optimization has also been obtained by applying different concepts of multilayers as; alternating Ti and Al containing layers (U.S. Pat. No. 6,309,738), oxygen and non-oxygen containing layers (U.S. Pat. No. 6,254,984), one of the layers stacked in the multilayer consists itself of a multilayer (U.S. Pat. No. 6,077,596), alternating nitrogen content (U.S. Pat. No. 5,330,853) or using one metastable compound (U.S. Pat. No. 5,503,912) or as aperiodic multilayer (U.S. Pat. No. 6,103,357).

Further improvements in thermal stability and hardness have been achieved by the introduction of Si into TiN- or TiAlN-based coatings. JP 2000-334607 discloses a coated tool with laminated layers comprising TiSi (layer a) and TiAl (layer b) compounds. The (a) layer is selected among nitride, carbonitride, oxynitride and oxycarbonitride containing 10%<Si<60% with a NaCl type crystalline structure. Layer (b) is selected among nitride, carbonitride, oxynitride and oxycarbonitride containing 40%<Al<75% with a NaCl type crystalline structure. The (a) layer and (b) layers are applied alternately and the (b) layer is located just above the surface of the base material.

EP 1939327 discloses a cutting tool comprising a hard coating giving improved crater and flank wear resistance, said coating comprising an aperiodic multilayer X+Y+X+Y+ . . . with average layer thickness of X and Y layers of between 0.1 and 100 nm and with average chemical composition $Al_aTi_b$-$Si_cCr_dC_eN_{1-e}$, where 0<a<0.5, 0.1<b<0.9, 0.01<c<0.17, 0≤d<0.06, a+b+c+d=1, and 0≤e<1.

The trends towards dry-work processes for environmental protection, i.e., metal cutting operation without using cutting fluids (lubricants) and accelerated machining speed with improved process put even higher demands on the characteristics of the tool materials due to an increased tool cutting-edge temperature. In particular, coating stability at high temperatures, e.g., oxidation- and wear-resistance have become even more crucial.

SUMMARY OF THE INVENTION

It is an object of the present invention to provide a coated cutting tool yielding improved performance in metal cutting applications at elevated temperatures.

It is a further object of the present invention to provide a coated cutting tool with improved edge integrity.

It has been found that combining layers based on (Ti,Si)N and (Ti,Al)N, respectively, in a nanolaminated coating structure onto a cutting tool insert significantly improves the tool life due to increased crater wear resistance, flank wear resistance and edge integrity, especially in machining operations generating high tool temperatures.

DETAILED DESCRIPTION OF THE INVENTION

Figure 1:
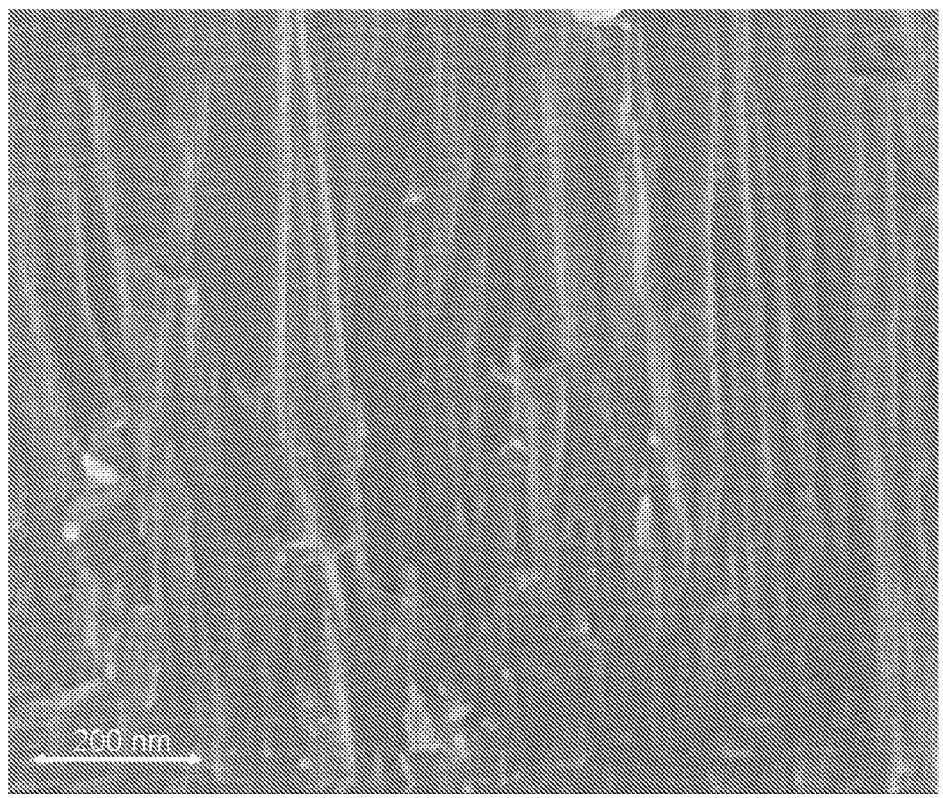
FIG. 1; Scanning electron microscopy (SEM) image showing a fractured cross section of a $Ti_{0.38}Al_{0.62}N/Ti_{0.93}Si_{0.07}N$ nanolaminated structure.

According to the present invention, there is provided a cutting tool for machining by chip removal comprising a body of a hard alloy of cemented carbide, cermet, ceramics, cubic boron nitride based material or high speed steel, preferably cemented carbide and cermet, onto which is deposited a hard and wear resistant coating comprising a polycrystalline nanolaminated structure of alternating A and B layers with a thickness between 0.5 and 20 μm, preferably between 0.5 and 10 μm, most preferably between 0.5 and 5 μm. Preferably the nanolaminated structure has an overall columnar structure with average column width between 20 and 1000 nm, preferably between 20 and 500 nm, as determined by, e.g., cross section scanning electron microscopy of a middle region of the nanolaminated structure, i.e., in a region within 30 to 70% of the thickness in the growth direction, and said average columnar width is the average from measuring the width of at least ten adjacent columns.

Said layer A is $(Ti_{1-x-p}Al_xMe1_p)N_a$, where 0.3<x<0.95, preferably 0.45<x<0.75, and 0.90<a<1.10, preferably 0.96<a<1.04, 0≤p<0.15, and Me1 is one or more of the metal elements from group 3, 4, 5 or 6 in the periodic table, preferably one or more of Zr, Y, V, Nb, Mo and N, most preferably one or more of Zr, Y, V and Nb. Said layer B is $(Ti_{1-y-z}Si_yMe2_z)N_b$, where 0.05<y<0.25 preferably 0.05<y<0.18, 0≤z<0.4, 0.9<b<1.1, preferably 0.96<b<1.04, and Me2 is one or more of the metal elements from group 3, 4, 5 or 6 in the periodic table including Al, preferably one or more of Y, V, Nb, Mo, N and Al, most preferably one or more of Y, V, Nb and Al, Layers A and B have an average individual layer thickness between 1 nm and 50 nm, as measured by, e.g., cross sectional transmission electron microscopy of a middle region of the nanolaminated structure, i.e., a region within 30 to 70% of the thickness in the growth direction, and said average layer thickness is the average from measuring the thickness of at least ten adjacent layers. Said nanolaminated structure comprises a phase mixture of cubic and hexagonal phases, preferably only cubic phases, as determined by X-ray diffraction.

In a first preferred embodiment z=p=0.

In a second preferred embodiment Me1 is one or more of Zr, Y, V and Nb with 0<p<0.05.

In a third preferred embodiment Me2 is Y, 0<z<0.15.

In a fourth preferred embodiment Me2 is one or both of V and Nb with 0<z<0.3.

In a fifth preferred embodiment Me2 is Al, 0.2<z<0.4.

Within the nanolaminated structure, Layer A has a stress level of −5.0<a<0 GPa, preferably −3.0<σ<−0.5 GPa.

Said coating may comprise an inner single- and/or multilayer coating of TiN, TiC, Ti(C,N) or (Ti,Al)N, preferably (Ti,Al)N, and/or an outer single- and/or multilayer coating of TiN, TiC, Ti(C,N), (Ti,Si)N or (Ti,Al)N, preferably (Ti,Si)N or (Ti,Al)N, according to prior art, to a total coating thickness, including the thickness of the nanolaminated structure, of between 0.5 and 30 μm, preferably between 0.5 and 15 μm, and most preferably between 0.5 and 10 μm.

The deposition method for the coatings of the present invention is physical vapour deposition (PVD), preferably cathodic arc evaporation, using alloy or composite cathodes under the following conditions; (Ti,Al,Me1)N and (Ti,Si,Me2)N layers are grown from cathodes yielding the desired layer composition. The evaporation current is between 50 A and 200 A. The layers are grown in an Ar+$N_2$ atmosphere, preferably in a pure $N_2$ atmosphere, at a total pressure of 0.5 Pa to 9.0 Pa, preferably 1.5 Pa to 5.0 Pa. The bias is −10 V to −300 V, preferably −20 V to −200V. The deposition temperature is between 350° C. and 700° C., preferably between 400° C. and 650° C.

The invention also relates to the use of cutting tool inserts according to the above for machining of stainless steel, super alloys and hardened steel at cutting speeds of 50-500 m/min, preferably 50-300 m/min, with an average feed of 0.08-0.5 mm/rev, preferably 0.1-0.4 mm/rev, depending on cutting speed and insert geometry.

EXAMPLE 1

The coatings of Table 1 were deposited by cathodic arc evaporation onto the following inserts:

S1: Cemented carbide with (90 wt % WC+10 wt % Co)
S2: Cemented carbide with (94 wt % WC+6 wt % Co)
S3: Seco Tools commercial cermet grade, CM Before deposition, the inserts were cleaned in ultrasonic baths of an alkali solution and alcohol. The deposition chamber was evacuated to a base pressure of less than $2.0 \times 10^{-3}$ Pa, after which the inserts were sputter cleaned with Ar ions. The coatings were deposited from alloy or composite cathodes in 99.995% pure $N_2$ atmosphere at a total pressure of 2-6 Pa, using a bias of −20 to −60 V and an evaporation current of 60-200 A at 450° C. The cathodes were selected to yield the composition of Layer A and Layer B, respectively, and mounted on opposing sides of the deposition chamber in order to obtain the nanolaminated structure by fixture rotation. The average individual layer thickness was varied by altering the cathode current (60-200 A) and the rotation speed of the fixture (1-5 rpm). The total coating thickness was about 2 μm for all inserts as measured on the flank face.

FIG. 1 shows a scanning electron microscopy (SEM) image of a $Ti_{0.38}Al_{0.62}N/Ti_{0.93}Si_{0.07}N$ nanolaminated structure (coating 9). The individual layers are clearly seen, indicating minimal intermixing between adjacent layers. The individual layer thickness varies due to a 3-fold fixture rotation and a columnar microstructure extends throughout the nanolaminated structure.

Figure 2:
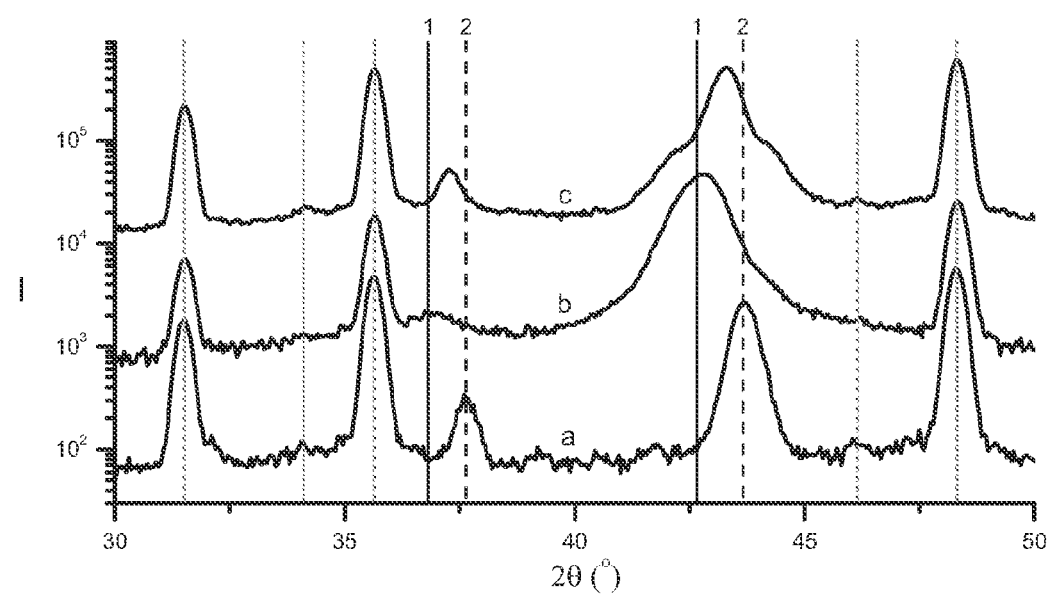
FIG. 2; X-ray diffraction patterns from (a) $Ti_{0.38}Al_{0.62}N$ single layer, (b) $Ti_{0.86}Si_{0.14}N$ single layer, and (c) $Ti_{0.38}Al_{0.62}N/Ti_{0.86}Si_{0.14}N$ nanolaminated structure. The diffraction peaks are indexed as cubic phase (Ti,Si)N (marked with 1), cubic phase (Ti,Al)N (marked with 2) and the peaks originating from the WC or Co (dotted lines).

X-ray diffractograms of as-deposited coatings were obtained using Cu Kα radiation and a θ-2θ configuration. FIG. 2 shows (a) $Ti_{0.38}Al_{0.62}N$ single layer (coating 39), (b) $Ti_{0.86}Si_{0.14}N$ single layer (coating 41), and (c) $Ti_{0.38}Al_{0.62}N/Ti_{0.86}Si_{0.14}N$ nanolaminated structure (coating 1). All three coatings display only cubic NaCl crystal structures.

The average residual stress, σ, is shown in Table 1. The stresses were evaluated by XRD measurements using the $\sin^2\psi$ method. The measurements were performed using CuKα-radiation on the NaCl (422)-reflections. Data was obtained with eleven Ψ-angles (positive and negative), equidistant within a $\sin^2\Psi$ range of 0 to 0.75)(Ψ=0-60°. The residual stress values were evaluated using a Poisson's ratio of ν=0.22 and Young's modulus of E=450 GPa. For the nanolaminated structures stress values were measured for the (Ti,Al)N layers.

The total average composition of the nanolaminated structure was measured by energy dispersive x-ray spectroscopy (EDS) analysis area using a LEO Ultra 55 scanning electron microscope with a Thermo Noran EDS detector operating at 10 kV. The data were evaluated using the Noran System Six (NSS version 2) software.

Table 1 summarizes the results for the example coatings, both according to the invention and comparative coatings according to prior art.

TABLE 1

| | | Composition Layer A (metal at. %) | | | | Composition Layer B (metal at. %) | | | |
|---|---|---|---|---|---|---|---|---|---|
| Coating | Description | Ti | Al | Si | Me1 | Ti | Al | Si | Me2*** |
| | Inventive | | | | | | | | |
| 1 | TiAlN/TiSiN* | 38 | 62 | 0 | 0 | 86 | 0 | 14 | 0 |
| 2 | TiAlN/TiSiN* | 38 | 62 | 0 | 0 | 86 | 0 | 14 | 0 |
| 3 | TiAlN/TiSiN* | 38 | 62 | 0 | 0 | 86 | 0 | 14 | 0 |
| 4 | TiAlN/TiSiN* | 38 | 62 | 0 | 0 | 86 | 0 | 14 | 0 |
| 5 | TiAlN/TiSiN* | 38 | 62 | 0 | 0 | 86 | 0 | 14 | 0 |
| 6 | TiAlN/TiSiN*,** | 38 | 62 | 0 | 0 | 86 | 0 | 14 | 0 |
| 7 | TiAlN/TiSiN* | 50 | 50 | 0 | 0 | 86 | 0 | 14 | 0 |
| 8 | TiAlN/TiSiN* | 38 | 62 | 0 | 0 | 93 | 0 | 7 | 0 |
| 9 | TiAlN/TiSiN* | 38 | 62 | 0 | 0 | 93 | 0 | 7 | 0 |
| 10 | TiAlN/TiSiN* | 50 | 50 | 0 | 0 | 93 | 0 | 7 | 0 |
| 11 | TiAlN/TiSiYN* | 38 | 62 | 0 | 0 | 84 | 0 | 12 | 4 |
| 12 | TiAlN/TiSiYN* | 38 | 62 | 0 | 0 | 83 | 0 | 9 | 8 |
| 13 | TiAlN/TiSiYN* | 38 | 62 | 0 | 0 | 79 | 0 | 7 | 14 |
| 14 | TiAlN/TiSiVN* | 38 | 62 | 0 | 0 | 82 | 0 | 11 | 7 |
| 15 | TiAlN/TiSiVN* | 38 | 62 | 0 | 0 | 76 | 0 | 9 | 15 |
| 16 | TiAlN/TiSiVN* | 50 | 50 | 0 | 0 | 70 | 0 | 7 | 23 |

TABLE 1-continued

| | | | | | | | | | | |
|---|---|---|---|---|---|---|---|---|---|---|
| 17 | TiAlN/TiSiNbN* | 38 | 62 | 0 | 0 | 85 | 0 | 10 | 5 | |
| 18 | TiAlN/TiSiNbN* | 38 | 62 | 0 | 0 | 78 | 0 | 8 | 14 | |
| 19 | TiAlN/TiSiNbN* | 38 | 62 | 0 | 0 | 69 | 0 | 6 | 25 | |
| 20 | TiAlN/TiSiAlN* | 38 | 62 | 0 | 0 | 67 | 21 | 12 | 0 | |
| 21 | TiAlN/TiSiAlN* | 38 | 62 | 0 | 0 | 55 | 39 | 6 | 0 | |
| 22 | TiAlN/TiSiAlN* | 38 | 62 | 0 | 0 | 60 | 32 | 8 | 0 | |
| 23 | TiAlYN/TiSiN* | 38 | 61 | 0 | 1 | 86 | 0 | 14 | 0 | |
| 24 | TiAlYN/TiSiN* | 37 | 59 | 0 | 4 | 86 | 0 | 14 | 0 | |
| 25 | TiAlVN/TiSiN* | 38 | 61 | 0 | 1 | 86 | 0 | 14 | 0 | |
| 26 | TiAlVN/TiSiN* | 37 | 59 | 0 | 4 | 86 | 0 | 14 | 0 | |
| 27 | TiAlNbN/TiSiN* | 38 | 61 | 0 | 1 | 86 | 0 | 14 | 0 | |
| 28 | TiAlNbN/TiSiN* | 37 | 59 | 0 | 4 | 86 | 0 | 14 | 0 | |
| 29 | TiAlZrN/TiSiN* | 38 | 61 | 0 | 1 | 86 | 0 | 14 | 0 | |
| 30 | TiAlZrN/TiSiN* | 37 | 59 | 0 | 4 | 86 | 0 | 14 | 0 | |
| 31 | TiAlZrN/TiSiVN* | 38 | 61 | 0 | 1 | 76 | 0 | 9 | 15 | |
| 32 | TiAlZrN/TiSiYN* | 37 | 59 | 0 | 4 | 84 | 0 | 12 | 4 | |
| 33 | TiAlVN/TiSiAlN* | 37 | 59 | 0 | 4 | 60 | 32 | 8 | 0 | |
| | Comparative | | | | | | | | | |
| 34 | TiN/TiSiN* | 100 | 0 | 0 | 0 | 86 | 0 | 14 | 0 | |
| 35 | TiAlSiN/TiSiN* | 61 | 32 | 7 | 0 | 93 | 0 | 7 | 0 | |
| 36 | TiAlN/TiSiN* | 80 | 20 | 0 | 0 | 93 | 0 | 7 | 0 | |
| 37 | TiAlN/TiSiN*,** | 38 | 62 | 0 | 0 | 86 | 0 | 14 | 0 | |
| 38 | TiN/TiAlSiN*,** | 100 | 0 | 0 | 0 | 61 | 32 | 7 | 0 | |
| 39 | TiAlN | 37.6 | 62.4 | 0.0 | 0.0 | 0.0 | 0.0 | 0.0 | 0.0 | |
| 40 | TiAlN | 49.6 | 50.4 | 0.0 | 0.0 | 0.0 | 0.0 | 0.0 | 0.0 | |
| 41 | TiSiN | 86.4 | 0.0 | 13.6 | 0.0 | 0.0 | 0.0 | 0.0 | 0.0 | |
| 42 | TiSiN | 92.8 | 0.0 | 7.2 | 0.0 | 0.0 | 0.0 | 0.0 | 0.0 | |
| 43 | TiAlSiN | 61.1 | 32.0 | 6.9 | 0.0 | 0.0 | 0.0 | 0.0 | 0.0 | |
| 44 | TiSiN + TiAlN** | 85.9 | 0.0 | 14.1 | 0.0 | 38.0 | 62.0 | 0.0 | 0.0 | |
| 45 | TiAlN + TiSiN** | 38.3 | 61.7 | 0.0 | 0.0 | 86.0 | 0.0 | 14.0 | 0.0 | |

| Coating | Description | Average composition (at. %) | | | | | | Layer thickn. (nm) | | σ (GPa) Layer |
|---|---|---|---|---|---|---|---|---|---|---|
| | | Ti | Al | Si | Me1 | Me2*** | N | A | B | A |
| | Inventive | | | | | | | | | |
| 1 | TiAlN/TiSiN* | 31.9 | 12.6 | 4.1 | 0.0 | 0.0 | 51.4 | 5 | 8 | −0.9 |
| 2 | TiAlN/TiSiN* | 39.1 | 5.7 | 5.6 | 0.0 | 0.0 | 49.6 | 4 | 17 | −0.5 |
| 3 | TiAlN/TiSiN* | 26.1 | 21.2 | 2.2 | 0.0 | 0.0 | 50.4 | 11 | 5 | −1.9 |
| 4 | TiAlN/TiSiN* | 34.3 | 11.8 | 4.5 | 0.0 | 0.0 | 49.4 | 3 | 5 | −0.7 |
| 5 | TiAlN/TiSiN* | 27.9 | 18.5 | 2.9 | 0.0 | 0.0 | 50.6 | 24 | 17 | −2.3 |
| 6 | TiAlN/TiSiN*,** | 31.4 | 14.4 | 3.8 | 0.0 | 0.0 | 50.3 | 7 | 8 | −1.1 |
| 7 | TiAlN/TiSiN* | 33.1 | 13.1 | 3.4 | 0.0 | 0.0 | 50.5 | 10 | 9 | −1.4 |
| 8 | TiAlN/TiSiN* | 35.3 | 13.6 | 1.9 | 0.0 | 0.0 | 49.1 | 6 | 8 | −1.3 |
| 9 | TiAlN/TiSiN* | 32.1 | 16.3 | 1.7 | 0.0 | 0.0 | 50.0 | 9 | 6 | −1.4 |
| 10 | TiAlN/TiSiN* | 38.7 | 10.4 | 2.0 | 0.0 | 0.0 | 48.9 | 5 | 6 | −1.0 |
| 11 | TiAlN/TiSiYN* | 29.5 | 16.7 | 2.8 | 0.0 | 1.0 | 50.1 | 11 | 10 | — |
| 12 | TiAlN/TiSiYN* | 31.9 | 12.8 | 2.6 | 0.0 | 2.3 | 50.4 | 4 | 6 | — |
| 13 | TiAlN/TiSiYN* | 28.7 | 16.7 | 1.6 | 0.0 | 3.3 | 49.8 | 8 | 7 | — |
| 14 | TiAlN/TiSiVN* | 32.5 | 13.9 | 3.1 | 0.0 | 2.0 | 48.5 | 7 | 9 | — |
| 15 | TiAlN/TiSiVN* | 27.0 | 17.7 | 2.1 | 0.0 | 3.3 | 50.0 | 10 | 8 | — |
| 16 | TiAlN/TiSiVN* | 32.4 | 9.5 | 2.1 | 0.0 | 7.1 | 48.8 | 5 | 8 | — |
| 17 | TiAlN/TiSiNbN* | 31.1 | 13.6 | 2.9 | 0.0 | 1.4 | 51.0 | 9 | 12 | — |
| 18 | TiAlN/TiSiNbN* | 27.9 | 16.8 | 1.9 | 0.0 | 3.3 | 50.1 | 8 | 7 | — |
| 19 | TiAlN/TiSiNbN* | 26.1 | 14.3 | 1.6 | 0.0 | 6.6 | 51.3 | 5 | 6 | — |
| 20 | TiAlN/TiSiAlN* | 29.4 | 18.4 | 3.6 | 0.0 | 0.0 | 48.6 | 5 | 8 | — |
| 21 | TiAlN/TiSiAlN* | 22.3 | 25.9 | 1.6 | 0.0 | 0.0 | 50.3 | 5 | 6 | — |
| 22 | TiAlN/TiSiAlN* | 24.5 | 22.6 | 2.1 | 0.0 | 0.0 | 50.7 | 6 | 7 | — |
| 23 | TiAlYN/TiSiN* | 34.0 | 11.9 | 4.2 | 0.4 | 0.0 | 49.8 | 6 | 9 | — |
| 24 | TiAlYN/TiSiN* | 34.4 | 12.3 | 4.2 | 1.0 | 0.0 | 49.1 | 5 | 7 | — |
| 25 | TiAlVN/TiSiN* | 32.6 | 11.7 | 4.2 | 0.4 | 0.0 | 51.5 | 5 | 8 | — |
| 26 | TiAlVN/TiSiN* | 34.7 | 12.6 | 3.9 | 1.0 | 0.0 | 48.8 | 6 | 8 | — |
| 27 | TiAlNbN/TiSiN* | 34.4 | 12.5 | 4.3 | 0.4 | 0.0 | 48.9 | 6 | 9 | — |
| 28 | TiAlNbN/TiSiN* | 34.3 | 11.2 | 4.2 | 1.0 | 0.0 | 50.3 | 5 | 8 | — |
| 29 | TiAlZrN/TiSiN* | 31.7 | 14.4 | 3.9 | 0.5 | 0.0 | 50.1 | 6 | 7 | — |
| 30 | TiAlZrN/TiSiN* | 32.4 | 13.3 | 4.0 | 1.1 | 0.0 | 50.3 | 7 | 9 | — |
| 31 | TiAlZrN/TiSiVN* | 29.3 | 13.0 | 2.6 | 0.4 | 4.3 | 50.8 | 5 | 7 | — |
| 32 | TiAlZrN/TiSiYN* | 33.8 | 11.3 | 3.7 | 0.9 | 1.2 | 49.9 | 5 | 8 | — |
| 33 | TiAlVN/TiSiAlN* | 23.7 | 22.9 | 2.1 | 0.9 | 0.0 | 51.3 | 6 | 7 | — |
| | Comparative | | | | | | | | | |
| 34 | TiN/TiSiN* | 45.4 | 0.0 | 4.1 | 0.0 | 0.0 | 50.5 | 9 | 12 | −3.0 |
| 35 | TiAlSiN/TiSiN* | 36.7 | 9.5 | 3.5 | 0.0 | 0.0 | 50.3 | 10 | 7 | −2.1 |

TABLE 1-continued

| | | | | | | | | | | |
|---|---|---|---|---|---|---|---|---|---|---|
| 36 | TiAlN/TiSiN* | 44.0 | 5.0 | 1.8 | 0.0 | 0.0 | 49.2 | 9 | 9 | −2.5 |
| 37 | TiAlN/TiSiN*,** | 27.6 | 19.2 | 2.7 | 0.0 | 0.0 | 50.6 | 130 | 80 | −2.6 |
| 38 | TiN/TiAlSiN*,** | 39.3 | 8.7 | 1.9 | 0.0 | 0.0 | 50.1 | 110 | 130 | −3.1/−3.3 |
| 39 | TiAlN | — | — | — | — | — | 50.4 | — | — | −2.7 |
| 40 | TiAlN | — | — | — | — | — | 50.6 | — | — | −2.3 |
| 41 | TiSiN | — | — | — | — | — | 49.5 | — | — | −3.1 |
| 42 | TiSiN | — | — | — | — | — | 49.6 | — | — | −2.4 |
| 43 | TiAlSiN | — | — | — | — | — | 50.0 | — | — | −2.9 |
| 44 | TiSiN + TiAlN** | | N (at. %): 51.1/49.5 | | | | | 1080 | 1250 | — |
| 45 | TiAlN + TiSiN** | | N (at. %): 50.1/50.5 | | | | | 1140 | 870 | — |

*Individual layer compositions are estimated from the corresponding single layers.
**Constant individual layer thicknesses.
***Me2 content excluding Al, which has its own column.

EXAMPLE 2

Figure 3:
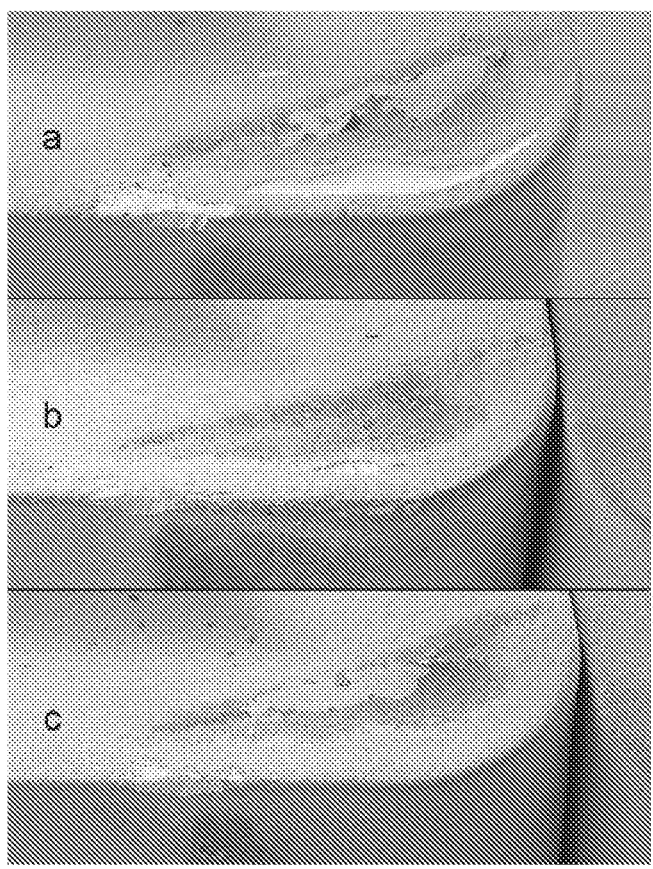
FIG. 3; Scanning electron microscopy (SEM) images showing examples of the cutting edges after 11 minutes of turning in stainless steel showing (a) $Ti_{0.38}Al_{0.62}N$ single layer, (b) $Ti_{0.66}Al_{0.29}Si_{0.05}N$ single layer, and (c) $Ti_{0.38}Al_{0.62}N/Ti_{0.93}Si_{0.07}N$ nanolaminated structure.

Coatings 1-8, 10, 12, 22, 29, 34-45 on S1 inserts were tested under the following conditions:
Geometry: CNMG120408-MF1
Application: Longitudinal turning
Work piece material: AISI 316L
Cutting speed: 230 m/min
Feed: 0.15 mm/rev
Depth of cut: 1.5 mm
Tool life criteria: Flank wear (vb)>0.3 mm
The results are presented in Table 2.
FIG. 3 shows SEM images of used edges after 11 minutes turning with (a) comparative coating 39, (b) comparative coating 43, and (c) inventive coating 8. It is clearly seen that the inventive coating show improved crater and edge wear characteristics.

EXAMPLE 3

Coatings 1, 4, 6, 15, 33, 37, 39, 41, 45 on S2 inserts were tested under the following conditions:
Geometry: CNMG120408-MF1
Application: Longitudinal turning
Work piece material: Inconel 718
Cutting speed: 70 m/min
Feed: 0.2 mm/rev
Depth of cut: $a_p$=0.5 mm
Tool life criteria: Flank wear (vb)>0.3 mm
The results are presented in Table 2.

EXAMPLE 4

Coatings 1, 3, 9, 17, 36, 39-45 on S3 inserts were tested under the following conditions:
Geometry: DCMT11T304-F1
Application: Longitudinal turning
Work piece material: DIN 100Cr6
Cutting speed: 250 m/min
Feed: 0.15 mm/rev
Depth of cut: $a_p$=0.5 mm
Tool life criteria: Flank wear (vb)>0.2 mm
The results are presented in Table 2.

TABLE 2

| | Example 2 | | Example 3 | Example 4 |
|---|---|---|---|---|
| Coating | Crater | Edge | Life time (min) | Life time (min) | Life time (min) |
| Inventive | | | | | |
| 1 | Good | Good/Medium | 15 | 8 | 21 |
| 2 | Good | Medium | 14 | — | — |
| 3 | Good/Medium | Good | 13 | — | 18 |
| 4 | Good | Good/Medium | 14 | 8 | — |
| 5 | Good/Medium | Good/Medium | 15 | — | — |
| 6 | Good | Good/Medium | 13 | 9 | — |
| 7 | Good/Medium | Good/Medium | 12 | — | — |
| 8 | Good | Good | 16 | — | — |
| 9 | — | — | — | — | 21 |
| 10 | Good/Medium | Good | 14 | — | — |
| 12 | Good/Medium | Good/Medium | 15 | — | — |
| 15 | — | — | — | 9 | — |
| 17 | — | — | — | — | 21 |
| 22 | Good | Good | 15 | — | — |
| 29 | Good | Good/Medium | 14 | — | — |
| 33 | — | — | — | 10 | — |
| Comparative | | | | | |
| 34 | Medium | Good/Medium | 10 | — | — |
| 35 | Good | Poor | 12 | — | — |
| 36 | Medium | Good/Medium | 12 | — | 17 |
| 37 | Good/Medium | Poor | 13 | 7 | — |
| 38 | Good/Medium | Poor | 12 | — | — |
| 39 | Medium/Poor | Good | 11 | 6 | 14 |
| 40 | Poor | Good | 8 | — | 12 |
| 41 | Good | Poor | 9 | 5 | 12 |
| 42 | Good/Medium | Medium/Poor | 9 | — | 15 |

TABLE 2-continued

| | Example 2 | | Example 3 | Example 4 |
|---|---|---|---|---|
| Coating | Crater | Edge | Life time (min) | Life time (min) | Life time (min) |
| 43 | Good/Medium | Medium | 12 | — | 15 |
| 44 | Medium | Good/Medium | 7 | — | 17 |
| 45 | Good/Medium | Medium/Poor | 10 | 5 | 15 |

It is obvious from the above examples 2-4 that the inserts according to the invention show an increased tool performance with improved edge and crater wear characteristics.

The invention claimed is:

1. A cutting tool insert for machining by chip removal, comprising:
    a body of a hard alloy of cemented carbide, cermet, ceramics, cubic boron nitride based material or high speed steel; and
    a coating deposited on the body by physical vapour deposition, said coating comprising
    a columnar and polycrystalline nanolaminated structure of alternating A and B layers where
    layer A is $(Ti_{1-x-p}Al_xMe1_p)N_a$, with $0.3<x<0.95$, $0.90<a<1.10$, $0\leq p<0.15$, and Me1 is one or more of Zr, Y, V, Nb, Mo or N, and where
    layer B is $(Ti_{1-y-z}Si_yMe2_z)N_b$, with $0.05<y<0.25$, $0\leq z<0.4$, $0.9<b<1.1$, and Me2 is one or more of Y, V, Nb, Mo, N and Al, with a thickness of the nanolaminated structure between 0.5 and 20 µm, an average column width between 20 and 1000 nm, and an average individual thickness of A and B layers between 1 and 50 nm.

2. The cutting tool insert according to claim 1, wherein said nanolaminated structure comprises a phase mixture of cubic and hexagonal phases, as determined by X-ray diffraction.

3. The cutting tool insert according to claim 1, wherein z=p=0.

4. The cutting tool insert according to claim 1, wherein said coating comprises an inner single- and/or multilayer coating of TiN, TiC, Ti(C,N) or (Ti, Al) N, and/or an outer single- and/or multilayer coating of TiN, TiC, Ti(C,N), (Ti,Si)N or (Ti,Al)N, to a total coating thickness, including the thickness of the nanolaminated structure, of between 0.5 and 30 µm.

5. The cutting tool insert according to claim 1, wherein said body is cemented carbide or cermet.

6. A method of making a cutting tool insert according to claim 1, comprising:
    depositing said coating by cathodic arc evaporation of alloyed or composite cathodes yielding the desired composition of the (Ti,Al,Me1)N and (Ti,Si,Me2)N layers using an evaporation current between 50 A and 200 A, in an Ar+N₂ atmosphere, at a total pressure of 0.5 Pa to 9.0 Pa, a bias between −10 V and −300 V, at 350° C. to 700° C.

7. A method for machining of stainless steel, super alloys or hardened steel, which comprises:
    machining with the cutting tool insert of claim 1 at cutting speeds of 50-500 m/min, with an average feed of 0.08-0.5 mm/rev.

8. The cutting tool insert according to claim 2, wherein z=p=0.

9. The cutting tool insert according to claim 1, wherein $0.45<a<0.75$.

10. The cutting tool insert according to claim 1, wherein $0.96<a<1.04$.

11. The cutting tool insert according to claim 1, wherein $0.05<y<0.18$.

12. The cutting tool insert according to claim 1, wherein $0.96<b<1.04$.

13. The cutting tool insert according to claim 1, wherein the thickness of the laminated structure is between 0.5 and 1.0 µm.

14. The cutting tool insert according to claim 1, wherein said nanolaminated structure comprises only cubic phases.

15. The cutting tool insert according to claim 1, wherein said coating comprises an inner single- and/or multilayer coating of (Ti,Al)N, and/or an outer single- and/or multilayer coating of (Ti,Si)N or (Ti,Al)N, to a total coating thickness, including the thickness of the nanolaminated structure, of between 0.5 and 15 µm.

16. A method of making a cutting tool insert according to claim 1, comprising:
    depositing said coating by cathodic arc evaporation of alloyed or composite cathodes yielding the desired composition of the (Ti,Al,Me1)N and (Ti,Si,Me2)N layers using an evaporation current between 50 A and 200 A, in a pure N₂ atmosphere, at a total pressure of 1.5 Pa to 5.0 Pa, a bias between −20 V and −200 V, at 400° C. to 650° C.

17. A method for machining of stainless steel, super alloys or hardened steel, which comprises:
    machining with the cutting tool insert of claim 1 at cutting speeds of 50-300 m/min, with an average feed of 0.1-0.4 mm/rev.

18. A cutting tool insert, comprising:
    a body of a hard alloy of cemented carbide, cermet, ceramics, cubic boron nitride based material or high speed steel; and
    a coating on the body, said coating comprising
    a columnar and polycrystalline nanolaminated structure of alternating A and B layers where
    layer A is $(Ti_{1-x-p}Al_xMe1_p)N_a$, with $0.3<x<0.95$, $0.90<a<1.10$, $0\leq p<0.15$, and Me1 is one or more of Zr, Y, V, Nb, Mo or W, and where
    layer B is $(T_{1-y-z}Si_yMe2_z)N_b$, with $0.05<y<0.25$, $0\leq z<0.4$, $0.9<b<1.1$, and Me2 is one or more of Y, V, Nb, Mo, W and Al, with a thickness of the nanolaminated structure between 0.5 and 20 µm, an average column width between 20 and 1000 nm, and an average individual thickness of A and B layers between 1 and 50 nm.

* * * * *